Feb. 11, 1969 NAGAICHI SUGA 3,426,590

APPARATUS FOR EXPOSING SAMPLES TO LIGHT

Filed Nov. 10, 1964

INVENTOR

NAGAICHI SUGA

BY Wenderoth, Lind & Ponack

ATTORNEYS

Feb. 11, 1969 NAGAICHI SUGA 3,426,590

APPARATUS FOR EXPOSING SAMPLES TO LIGHT

Filed Nov. 10, 1964 Sheet 2 of 2

INVENTOR

NAGAICHI SUGA

BY Wenderoth, Lind and Ponack

ATTORNEYS

United States Patent Office 3,426,590
Patented Feb. 11, 1969

3,426,590

APPARATUS FOR EXPOSING SAMPLES TO LIGHT

Nagaichi Suga, 2 Toyama-cho, Shinjuku-ku, Tokyo, Japan

Filed Nov. 10, 1964, Ser. No. 410,074
U.S. Cl. 73—150 7 Claims
Int. Cl. G01n *17/00;* G01j *3/14*

This invention relates to an apparatus for exposing samples to light of various wavelengths, and more particularly to an apparatus which is quite simple yet can expose samples to many different combinations and permutations of different wavelengths of light.

It is well known that almost all materials fade or deteriorate with exposure to light. However there are many substances, particularly among the recently developed synthetic fibers, dyestuffs and pigments, which fade or deteriorate much more rapidly when exposed to light which includes light of specific wavelengths.

While most light ageing of materials is due to exposure of the materials to solar radiation, the spectral distribution of the light in solar radiation is not uniform at all times. For example, synthetic materials of the propylene class are known to suffer relatively great damage due to exposure to solar light during the six month period from March to August in the northern hemisphere, while very little damage is observed during the remainder of the year. This can be explained by the fact that ultraviolet rays in the shorter range of 290 m$\mu$ produce a photochemical effect in propylene, and the amount of radiation in this range which is present in sunlight in the winter months is very much less than in the summer months.

Because of this variation in the composition of solar radiation, if it is desired to test a sample full, it is necessary to expose it to sunlight for at least a full year. If it is desired to accelerate the exposure process, some provision must be made for providing a source of light which can have the composition thereof varied in the same manner that natural solar radiation varies.

Moreover, it is often desirable to determine the wavelength of the radiations which play the important role in the ageing of a particular material, or the particular wavelengths and their proportional amounts in light of a certain composition which have the greatest ageing effect on a particular material. For example, the material sold under the name Teflon, a trademark of E. I. du Pont de Nemours & Co. for a plastic consisting of tetrafluoroethylene polymer is known to suffer from exposure to solar radiation in amount of $1,215\times10^3$ Kcal./m.$^2$ year. However, the weathering in this instance is not caused uniformly by the light over the whole scale of wavelengths, but rather is mostly caused by light of the following composition:

| | |
|---|---|
| 290–310 m$\mu$ (A range) | $200\times10^3$ Kcal./m.$^2$ |
| 450–480 m$\mu$ (B range) | $30\times10^3$ Kcal./m.$^2$ |
| 550–610 m$\mu$ (C range) | $5\times10^3$ Kcal./m.$^2$ |

Thus, of the $1,215\times10^3$ Kcal./m.$^2$ of solar energy, it is the energy produced by the light of the above composition with the light in the A, B and C ranges that does most of the damage. In other words, 235 Kcal./m.$^2$ of light containing only radiation in the A range, B range and C range, and in the proportions 200:30:5 has substantially the same damaging effect on the material as the entire amount of solar radiation.

In addition, the percentage of ageing which is caused by these radiations is not directly proportional to the proportion of radiations in the light, it being known that the radiations in the A range plus the B range cause 60% of the ageng, while the A range by itself causes 50%, the B range 5% and the C range 2%.

Heretofore, testing apparatus for testing the ageing characteristics of materials in light have used arc lamps, xenon lamps, and mercury arc lamps as sources of light, and these light sources are designed so as to have a spectral energy distribution similar to natural solar radiation through the whole range from ultraviolet to infrared. These sources of light have been used in combination with means for controlling temperature, humidity and rainfall in order to test samples without the necessity of exposing them to natural solar energy. However, these devices have not, without the addition thereto or the inclusion therein of complex controls, filters, etc. been able to provide light of different specific wavelengths for subjecting samples to only these specific wavelengths, or to produce permutations and combinations of groups of wavelengths less than the entire spectrum of the light source. With the increased activity in research on photochemical reactions and the necessity for light sources which can be varied in many different ways, it is desirable to have a simple apparatus in which the light source can be controlled in order to produce light of different wavelengths and having different proportions.

It is an object of the present invention to provide an apparatus which is relatively simple yet which is capable of producing visible radiations of different frequencies and permutations and combinations of visible radiations having different frequencies.

It is a further object of the present invention to provide an apparatus for testing samples for light fastness which is relatively simple yet which is capable of producing various types of light in different proportions and at different wavelengths for testing samples under varying conditions of exposure to natural solar radiation.

Other and further objects of the invention will be made clear from the following specification and claims, taken together with the accompanying drawings, in which:

Figure 1:
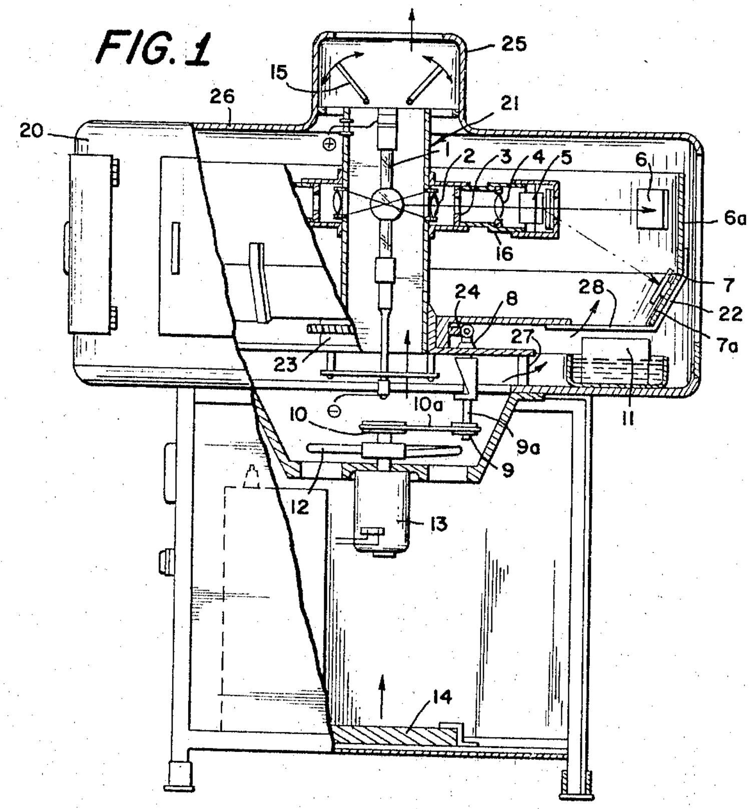
FIG. 1 is a sectional elevation view of a preferred form of the apparatus according to the present invention.
Figure 2:
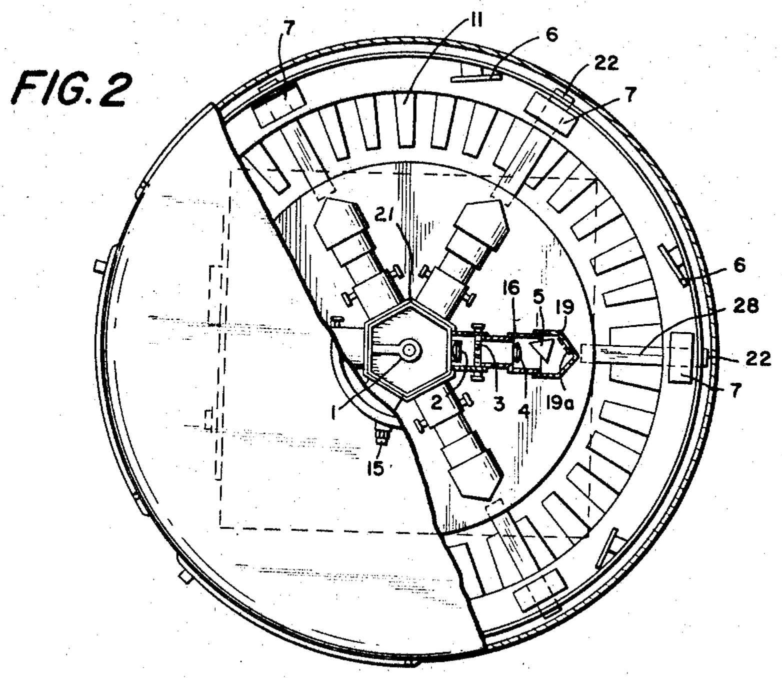
FIG. 2 is a top plan view of the apparatus of FIG. 1 with a part of the cover broken away to show the arrangement of the parts inside the apparatus.

As seen in FIGS. 1 and 2, a generally cylindrically housing 20 has mounted centrally therein a xenon lamp 1 and around the lamp is a polygonal lamp casing 21 in which are mounted a plurality of lenses 2 which act as condenser lenses for the several optical systems which will be described hereinafter. Each optical system is contained within a cylinder 16 which is radially mounted in the housing 20 and which is rotatable around its own axis. A rotatable sample holding drum 22 is rotatably mounted around the central cylindrical lamp casing 21, and the drum has a generally cylindrical surface 6*a* on which a plurality of first sample holding means 6 are positioned, and a truncated conical surface 7*a* on which a plurality of second sample holding means 7 are positioned. Positioned beneath the control cylindrical lamp casing 21 is a blower system having a fan 12 driven by a motor, in this instance an electric motor 13. The sample holding drum 22 is also driven from the motor 13 through a pulley 10 on the end of the motor shaft, the pulley 10 being coupled to a pulley 9 on shaft 9*a* by a belt 10*a*, and the shaft 9*a* having a means 8 on the end thereof opposite the pulley 9 which is coupled to the shaft portion 23 of the drum 22, in this instance the means 8 being a set of gears and there being a gear 24 on the shaft portion 23 of the drum 22.

Also provided within the housing 20 are humidifier means 11, an air intake filter 14, grids 27 and 28 for guiding air past the samples, and a damper 15 in a vent 25 on the cover 26 for the housing 20.

Figure 3:
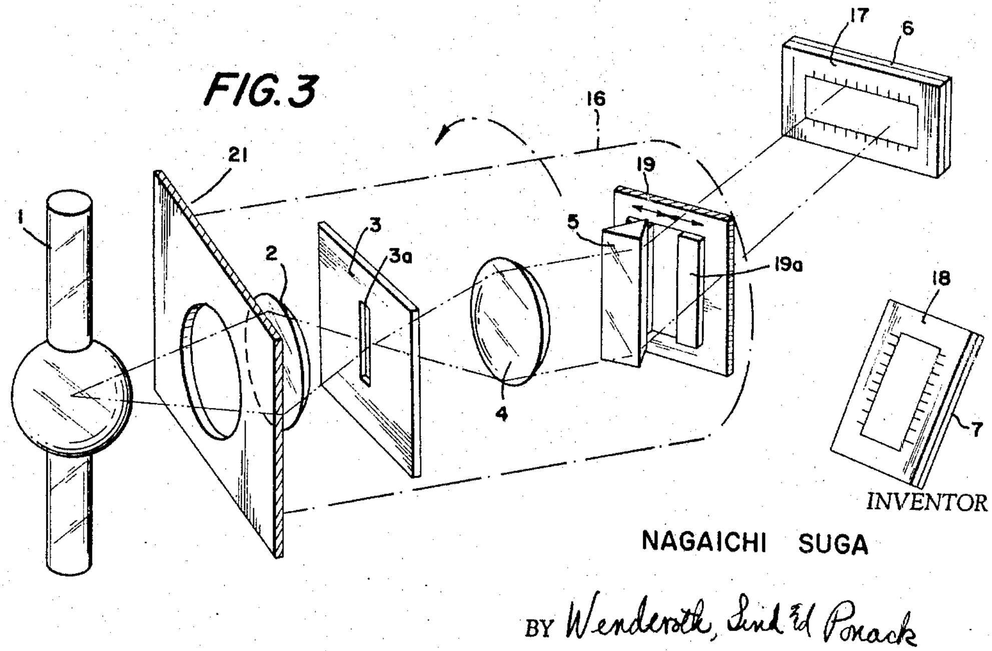
FIG. 3 is a schematic view, on an enlarged scale, of one of the optical systems in the apparatus.
Figure 4:
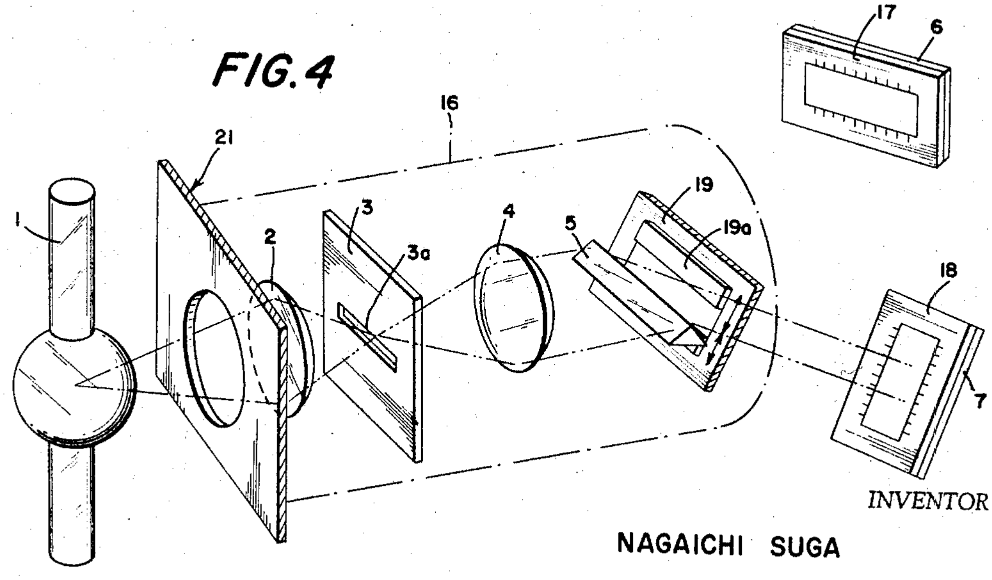
FIG. 4 is a view similar to FIG. 3 the optical system of FIG. 3 rotated 90° about its own axis.

As seen more clearly in FIGS. 3 and 4, the optical systems each have a screen 3 having a slit 3a therein, a lens 4 and a prism 5. The condenser lens 2 and the cylinder 16 within which the optical system is contained are positioned so that the condenser lens 2 will focus light on the slit 3a in the screen 3.

Adjacent the outer end of each of the cylinders 16 and slightly offset from the axis of the cylinder is a screening plate 19 having an adjustable slit 19a therein. Also provided as part of each of the first sample holding means 6 is a horizontal indicator frame 17 which has a horizontally elongated opening therein and markings thereon indicating the wavelength of light which strikes the sample at the various points along the length of the frame after the light has passed through the prism. As part of each of the second sample holding means 7 there is provided a vertical indicator frame 18 which has a vertically elongated opening therein and markings thereon indicating the wavelength of light which strikes the sample at the various points along the height of the frame after the light has passed through the prism.

In operation, if it is desired to test a sample for light fasteness for a particular range of wavelengths, the cylinder is rotated around its axis until it is in the FIG. 3 position, i.e. with the prism in a substantially vertical position with respect to the apparatus and with the screen 3 in a position such that the slit 3a therein is also in the vertical position. The sample is then positioned in the sample holding means 6 with the indicator frame 17 thereover, and the adjustable slit 19a in the screening plate 19 is narrowed until the light passed through it from the prism 5 corresponds to the desired range, as will be indicated on the indicator frame 17. When the temperature and humidity conditions within the housing 20 have been brought into the proper range by the operation of the blower 12 and damper 15 and the humidifier means 11, the lamp 1 is operated. A beam of light will pass through the vertical slit 3a in the screen 3, be refracted and dispersed by the prism 5 and will fall on the sample with the light of various wavelengths at different positions along the length of the opening in the frame 17. By driving the drum 22 at a uniform speed, the entire sample exposed through the frame 17 will receive light over the particular range or wavelengths passing through the screen for the same length of time.

Because any prism can very slightly from the ideal, it is desirable to have a plurality of prisms all with about the same characteristics and to move the sample past a succession of prisms in the successive optical systems. This reduces the effect of variations in any one prism on the overall exposure. However, where it is desired to expose the sample to a combination of ranges of wavelengths or particular wavelengths of light which cannot be produced by narrowing the opening in screen 19 to control light from a single prism, then the successive screens can be set so that the range of wavelengths passed by each is different, and rotation of the drum 22 will move the sample first through the beam having one range of wavelengths, and then through a second beam having a different range of wavelengths, and so on until the sum total of exposures gives the desired exposure conditions.

If it is desired to get a comparison of the effects of the different wavelengths of light on a single sample, the cylinders 16 are rotated to the FIG. 4 position in which the prism 5 is horizontal and the slit 3a in the screen 3 is horizontal. The sample is then placed in the sample holding means 7 and the frame 18 placed over it. The beam of light will then be refracted downwardly by the prism, and the light of various wavelengths at different positions along the height of the opening in the frame 18. Thus, each part of the sample will be exposed to light of only one wavelength during its passage past the opening in the frame 18. As with the method of operating the apparatus with the cylinders 16 in the FIG. 3 position, it is well to provide a plurality of similar prisms so that the effect of irregularities can be compensated for.

It is thought that the invention and its advantages will be understood from the foregoing description and it is apparent that various changes may be made in the form, construction and arrangement of the parts without departing from the spirit and scope of the invention or sacrificing its material advantages, the form hereinbefore described and illustrated in the drawings being merely a preferred embodiment thereof.

I claim:

1. An apparatus for exposing samples to light of various wavelengths, comprising a source of light similar to natural solar radiation, at least one optical system positioned in the path of light from said source of light for forming a narrow beam of light and including a prism for refraction and dispersion of the light into distinct wavelength bands, a screen having an adjustable width slit therein adjacent the other end of the optical system from the source of light and positioned to transmit selected bands of the light dispersed by said prism, rotating means on which at least said prism is mounted for rotation in the path of light, a first sample holder having an elongated slit therein through which material to be tested can be exposed, a second sample holder having an elongated slit therein substantially perpendicular to the slit in said first sample holder through which material to be tested can be exposed, and moving means on which said sample holders are mounted for moving the sample holders in a scanning movement completely through the beam of light dispersed by the prism in a direction transverse to the light emitted through the optical system, said moving means moving the first sample holder past the end of the optical system on a path to receive light directly from the prism on the opposite side of the screen from the optical system when the system is in a first position and moving the second sample holder past the end of the optical system on a path to receive light directly from the prism when the prism is rotated 90° from said first position.

2. An apparatus for exposing samples to light of various wavelengths, comprising a source of light similar to natural solar radiation, at least one optical system positioned in the path of light from said source of light for forming a narrow beam of light and including a prism for refraction and dispersion of the light into distinct wavelength bands, a screen having an adjustable width slit therein adjacent the other end of the optical system from the source of light and positioned to transmit selected bands of the light dispersed by said prism, rotating means on which at least said prism is mounted for rotation in the path of light, a first sample holder having an elongated slit therein through which material to be tested can be exposed, a second sample holder having an elongated slit therein substantially perpendicular to the slit in said first sample holder through which material to be tested can be exposed, and moving means on which said sample holders are mounted for moving the sample holders in a scanning movement completely through the beam of light dispersed by the prism in a direction transverse to the light emitted through the optical system, said moving means moving the first sample holder past the end of the optical system on a path to receive light diretcly from the prism on the opposite side of the screen from the optical system when the system is in a first position and moving the second sample holder past the end of the optical system on a path to receive light directly from the prism when the prism is rotated 90° from said first position, and temperature and humidity creating and control means mounted in said enclosure for establishing and maintaining predetermined temperature and humidity condition in said enclosure.

3. An apparatus for exposing samples to light of various wavelengths, comprising a source of light similar to natural solar radiation, at least one optical system posiin the path of light from said source of light for forming a narrow beam of light and including a prism for refraction and dispersion of the light into distinct wavelength bands, a screen having an adjustable width slit therein adjacent the other end of the optical system from the source of light and positioned to transmit selected bands of the light dispersed by said prism, a sample holder having an elongated slit extending in a direction substantially perpendicular to the direction in which the slit in said screen extends and through which material to be tested can be exposed, and moving means on which said sample holder is mounted for moving said sample holder in a scanning movement completely through the beam of light dispersed by the prism past the end of the optical system on a path to receive light directly from the prism on the opposite side of the screen from the optical system in a direction transverse to the light emitted through the optical system and the screen and in a direction generally parallel to the direction of elongation of the slit in the sample holder.

4. An apparatus for exposing samples to light of various wavelengths, comprising a source of light similar to natural solar radiation, at least one optical system positioned in the path of light from said source of light for forming a narrow beam of light and including a prism for refraction and dispersion of the light into distinct wavelength bands, a sample holder having an elongated slit therein through which material to be tested can be exposed, said slit extending in the direction in which the narrow beam of light is dispersed, and moving means on which said sample holder is mounted for moving said sample holder in a scanning movement completely through the beam of light dispersed by the prism past the end of the optical system in a direction transverse to the light emitted through the optical system on a path to receive light directly from the prism and in a direction generally perpendicular to the direction of elongation of the slit in the sample holder and to the direction in which the narrow beam of light is dispersed, whereby a sample exposed through the slit has parallel stripes thereon which have been exposed to different wavelengths of light in said dispersed beam of light.

5. An apparatus as claimed in claim 2 in which said source of light is centrally positioned in said enclosure, and there are a plurality of optical systems in a plane and extending radially from said source of light and substantially equidistantly spaced around said source of light, and said moving means comprises a drum on which said sample holders are mounted, said drum being rotatably mounted in said enclosure for rotation about an axis through said source of light and in said plane in which said optical systems are positioned, and means coupled to said drum for driving said drum.

6. An apparatus as claimed in claim 5 in which each of said optical systems has a substantially straight line optical axis and is rotatably mounted in said enclosure on said optical axis, and said second sample holder is spaced axially along said drum from said first sample holder and is mounted at an angle to the axis of said drum.

7. An apparatus as claimed in claim 1 in which said optical system has a substantially straight line optical axis and asid optical system and said screen are rotatably mounted about said optical axis, and said second sample holder is mounted on said moving means at a point spaced from said first sample holder in a direction parallel to the direction in which the slit in said screen extends when said optical system is in said first position and said moving means is movable to move said sample holders in a direction transverse to the direction in which said slit in said screen extends.

References Cited

UNITED STATES PATENTS

| | | | |
|---|---|---|---|
| 1,969,606 | 8/1934 | Hall. | |
| 2,336,550 | 12/1943 | Kruper. | |
| 2,434,450 | 1/1948 | Williford | 73—150 |
| 3,004,465 | 10/1961 | White. | |
| 3,224,266 | 12/1965 | Klippert | 73—150 |

JEWELL H. PEDERSEN, *Primary Examiner.*

A. A. KASHINSKI, *Assistant Examiner.*